United States Patent
Bellini et al.

(10) Patent No.: US 7,401,521 B2
(45) Date of Patent: Jul. 22, 2008

(54) PRESSURE SENSOR WITH INTEGRATED STRUCTURE

(75) Inventors: Paolo Bellini, Ivrea (IT); Renato Conta, Ivrea (IT)

(73) Assignee: Telecom Italia S.p.A., Milan (IT)

( * ) Notice: Subject to any disclaimer, the term of this patent is extended or adjusted under 35 U.S.C. 154(b) by 0 days.

(21) Appl. No.: 10/559,936

(22) PCT Filed: Jun. 9, 2004

(86) PCT No.: PCT/IT2004/000337

§ 371 (c)(1),
(2), (4) Date: Dec. 8, 2005

(87) PCT Pub. No.: WO2004/111595

PCT Pub. Date: Dec. 23, 2004

(65) Prior Publication Data

US 2006/0137461 A1    Jun. 29, 2006

(30) Foreign Application Priority Data

Jun. 13, 2003    (IT)    ............ TO2003A0444

(51) Int. Cl.
*G01L 7/00*    (2006.01)

(52) U.S. Cl. ............................................. 73/706
(58) Field of Classification Search ............... 73/721, 73/727, 725, 754, 706, 756
See application file for complete search history.

(56) References Cited

U.S. PATENT DOCUMENTS

| 4,763,098 A |   | 8/1988  | Glenn et al. |
| 4,823,605 A |   | 4/1989  | Stein |
| 5,454,270 A | * | 10/1995 | Brown et al. ............ 73/720 |
| 6,116,269 A | * | 9/2000  | Maxson ................. 137/487.5 |
| 6,148,673 A | * | 11/2000 | Brown .................... 73/721 |
| 6,351,996 B1 |  | 3/2002  | Bryzek et al. |

FOREIGN PATENT DOCUMENTS

EP    0 386 959    9/1990

* cited by examiner

*Primary Examiner*—Andre J. Allen
(74) *Attorney, Agent, or Firm*—Venable LLP; Robert Kinberg; Steven J. Schwarz

(57) ABSTRACT

Pressure sensor with an integrated structure comprising a support (33, 133, 233) and a silicon die (11), which lies substantially on the same plane as the upper surface (37, 137, 237) of the support and is integrated in a seat (34, 134, 234) made in the thickness of the support. On the inside face (23) of the die (11), in contact with the fluid the pressure of which has to be measured, is a protective layer.

14 Claims, 2 Drawing Sheets

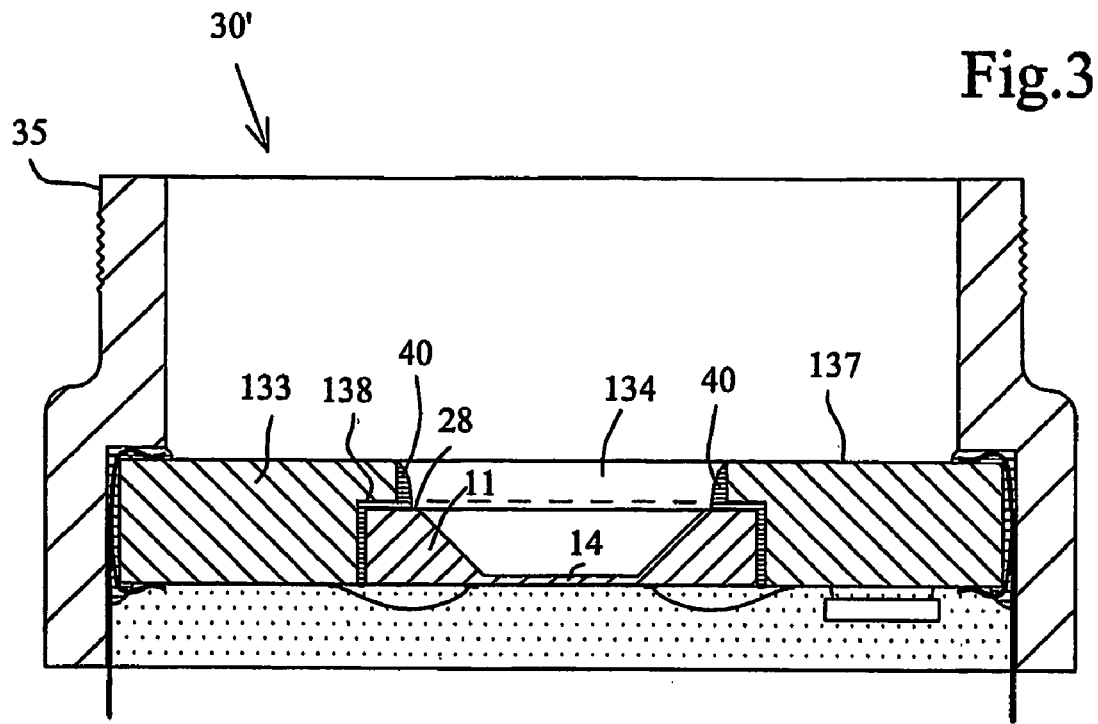
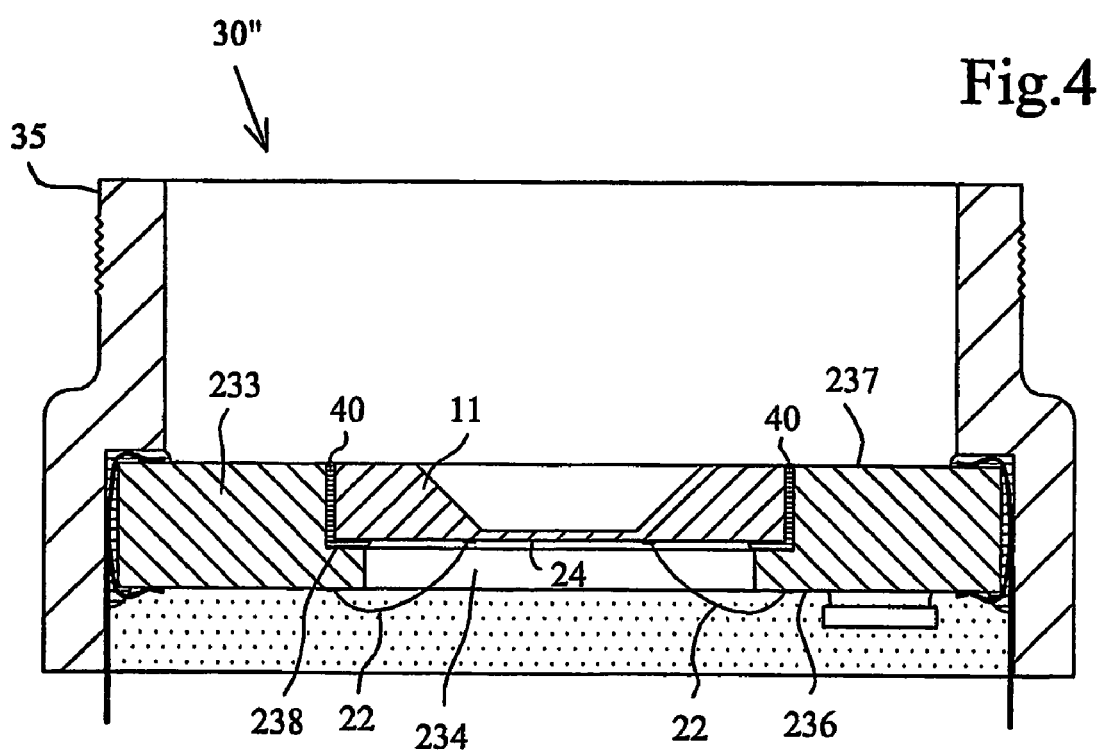

PRESSURE SENSOR WITH INTEGRATED STRUCTURE

This application is a U.S. National Stage application of co-pending PCT application PCT/IT2004/000337, filed Jun. 9, 2004, which claims the priority of Italy Patent Application No. TO2003A000444, filed Jun. 13, 2003. These applications are incorporated herein by reference in their entireties.

TECHNICAL FIELD

This invention relates to a pressure sensor with an integrated structure.

More, specifically, the invention relates to an integrated pressure sensor, suitable for use in hostile environments, comprising a silicon transducer assembled together with a support, as described in the main claim.

BACKGROUND ART

Of the many known types of pressure sensors, silicon sensors have had great market success, thanks especially to their reliability, low cost and compact dimensions.

The methods of production and operation of silicon sensors are known, and for this reason will not be described in detail herein, while only some characteristics important to the understanding of the invention will be described in greater detail.

Depicted in FIG. 1 is a silicon pressure sensor (10), constructed according to the known art: a silicon transducer or die (11) comprises a thin and flexible membrane (14), made by removing part of the silicon, for instance by chemical etching or by mechanical detachment; made using known techniques on an outer face (24) of the die, are piezoresistors (21) that are connected together so as to form a Wheatstone bridge.

When pressure is applied to the transducer (11), this causes the membrane (14) to flex, as a result of which the resistance of the piezoresistor (21) changes; in this way, when a voltage is applied to the circuit, a change in the current may be read when pressure is applied to the sensor.

The silicon transducer or die (11) is then glued, using for instance a silicon-based adhesive, to a plate (12), made of a material, pyrex, silicon or glass for example, that has a thermal expansion coefficient close to that of the transducer (11). When the sensor (10) is subjected to a change in temperature, the plate (12) undergoes an expansion similar to that of the die (11), thus avoiding stresses being brought about on the transducer (11) by a difference in expansion between the transducer (11) and the plate (12), which would cause read errors.

In turn the plate (12) is joined, using known techniques, to a support (13), which may be, for instance, of ceramic material or consist of a printed circuit.

Built on the support (13) is an electronic circuit, which is connected by way of bonding wires (22) to the piezoresistors (21) and which comprises components for amplifying and correcting the signal output by the sensor (10); the signal is in turn sent for reading to a board external to the sensor (10), not shown in any of the figures.

In many of the applications of pressure sensors, they have to be used in a hostile environment, which may for example consist of a fluid containing corrosive substances, or which is at high pressure or temperature.

In order to protect these sensors a resin shell is widely used (25), made using techniques known in the assembly of electronic components.

To allow the fluid to come into contact with the transducer (11), apertures (15) and (16) are made in the plate (12) and on the support (13), whilst an aperture (27) is made in the shell (25) that puts the sensor into communication with the outside, thus permitting the difference in pressure with the environment to be measured.

The piezoresistors (21) and the bonding wires (22) that are on the outer face (24) of the transducer (11) could be damaged by the action of an aggressive fluid; on the contrary, on an inner face (23) of the transducer (11) there are no delicate components and therefore there are no particular problems if the inner face (23) is in contact with the fluid.

For this reason, sensors have been produced for hostile environments, that are operated in such a way that the transducer (11) has its inner face (23) in contact with the aggressive fluid. In addition, the surface of the inner face (23) may be covered by a protective layer, made for instance of a layer made of alloys of chromium, tantalum, silicon carbide or others.

In these sensors, the outer face (24) of the die (11), which comprises delicate components such as the piezoresistors (21) and the bonding wires (22), is not in contact with the aggressive fluid.

In addition the transducer (11), the piezoresistors (21), the bonding wires (22), and the support (13), upon which the tracks of the electronic circuit are made, may be protected even further by covering them with a gel or a protective resin (26).

Should the fluid the pressure of which has to be measured, act on the opposite face of the sensor, i.e. the outer face (24), therefore passing through the aperture (27) of the shell (25), the gel (26) performs the function of protecting the outer face (24) of the transducer (11), with the piezoresistors (21) and the bonding wires (22), from the action of the same fluid.

In the latter case however, the gel (26) does not guarantee the surface of the outer face (24) of the die (11) a sure protection, as it may be damaged by the action of the aggressive elements present in the fluid.

The silicon sensors for hostile environments made according to the known art have a number of drawbacks: the protections needed for applications in hostile environments complicate construction of the sensor, requiring assembly of a large number of parts and sometimes the production of costly fixtures.

Another problem, where there are high pressures and an aggressive environment, may be caused by the join between the transducer (11) and the plate (12), which may not be resistant enough to support high stresses.

Moreover the application in hostile environments may give rise to applied tensions on the transducer (11), caused by sudden jumps in temperature or by transitory extra-tensions induced on the support (13) by the fluid itself, with resultant read errors.

In the sensor (10) made according to the known art, the plate (12) and the transducer (11) are glued above the support (13), and are therefore protruding with respect to the surface of the support This assembly leaves the transducer (11) more exposed to the action of external transitory forces, caused by the fluid itself, which can cause momentary incorrect pressure value readings or even damage the transducer.

SUMMARY OF THE INVENTION

The object of this invention is to produce a pressure sensor, for application in hostile environments, comprising a small number of easy to produce parts, which is easy to assemble, and therefore low cost.

A second object is to produce a sensor, comprising a transducer that is not subject to stress caused by deformations induced by external forces.

A third object is to produce a sensor, comprising a transducer that is protected if used in hostile environments.

A fourth object is to produce a sensor that is resistant if used for measuring high pressures.

These objects are achieved by the pressure sensor with integrated structure of the invention in accordance with the characteristic parts of the main claims.

These and other characteristics of the present invention will become apparent in the course of the following description, provided by way of non-restrictive example, with the aid of the accompanying drawings.

LIST OF FIGURES

FIG. 3 is a section view of a pressure sensor with integrated structure according to a second embodiment of the invention.

FIG. 4 is a section view of a pressure sensor with integrated structure according to a third embodiment of the invention.

DESCRIPTION

First embodiment

Figure 2:
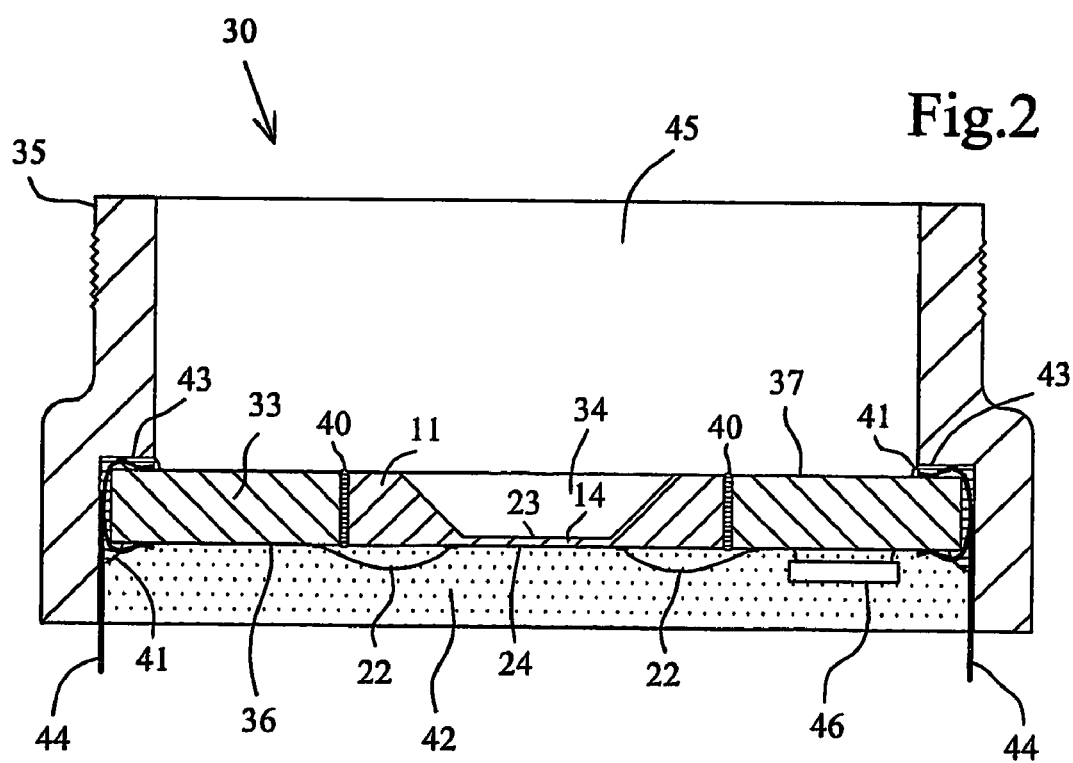
FIG. 2 is a section view of a pressure sensor with integrated structure according to this invention.

With reference to FIG. 2, a pressure sensor with integrated structure or sensor (30), according to the invention, consists of a transducer or die (11), having an upper edge (28), made of silicon according to the known art, a support (33), having an upper surface (37), and a-container (35).

The support (33) is made, for instance, of ceramic, or alternatively may also be made of a known type of printed circuit, and is glued to the container (35) by means of an adhesive (41), of the epoxy type for example. Made on the inner surface of the container (35) is a step (43) permitting a better gluing of the support (33).

Inside the support (33) is a seat (34), obtained from a mould or by a machining operation, in which the die (11) is integrated. To be able to house the die (11), the seat (34) must have the same profile as the die (11), but dimensions greater than those of the die.

The seat (34) may for instance have a width of about 0.1÷0.2 μm greater than that of the die (11), so as to create a space in which to insert an adhesive (40) for gluing of the die (11) to the support (33). The adhesive (40) may be silicon type, for instance, so that any tensions induced by the support (33) are not transmitted to the die (11).

The die (11) is then integrated in the seat (34), made in the thickness of the support (33) and is assembled in such a way that the upper edge (28) of the die (11) is substantially on the same plane as the upper surface (37) of the support (33).

The sensor (30) may for instance be screwed or joined by snap means, and is installed in such a way that the fluid the pressure of which has to be measured enters through an inlet (45), located in the top part of the container (35).

When the sensor (30) works in hostile environments, for example in contact with a fluid that may contain aggressive substances or be at high pressures or temperatures, the die (11) and the support (33) need to be protected.

For this reason the inner face (23) of the die, in contact with the fluid to be measured, is protected by means of known techniques, for instance by placing a layer made of chromium, tantalum, silicon carbide or other alloys on top.

Moreover, to protect the support (33) from attack from the fluid, its upper surface (37) may be, for instance, vitrified so as to make it impermeable to the action of the fluid.

In the sensor (30) made according to the invention, the bonding wires (22) and the piezoresistors, which are more fragile and could be damaged if coming into direct contact with the fluid, are on an outer face (24), opposite to the fluid to be measured, which is in contact with the external environment.

The bottom surface (36) of the support (33) also faces the outside, and on it a thick film circuit, not depicted in the figures, is produced and is connected to integrated or programmable electronic components (46) (IC and ASIC), used for amplification and adjustment of the sensor read signals.

For better protection of the thick film circuit, the electronic components (46), the bonding wires (22) and the piezoresistors of the die (11), they may be coated with a layer of silicon resin (42) which, being elastic, is capable of following the deformations of the membrane (14), and does not therefore influence the pressure measurement effected by the die (11).

Between the support (33) and the container (35), in the area filled by the adhesive (41), small feet (44) are inserted for electric connection of the sensor with an external circuit.

With the sensor produced according to the invention, a device can be manufactured using a small number of parts, and that is easier to manufacture than those of the known art.

Figure 1:
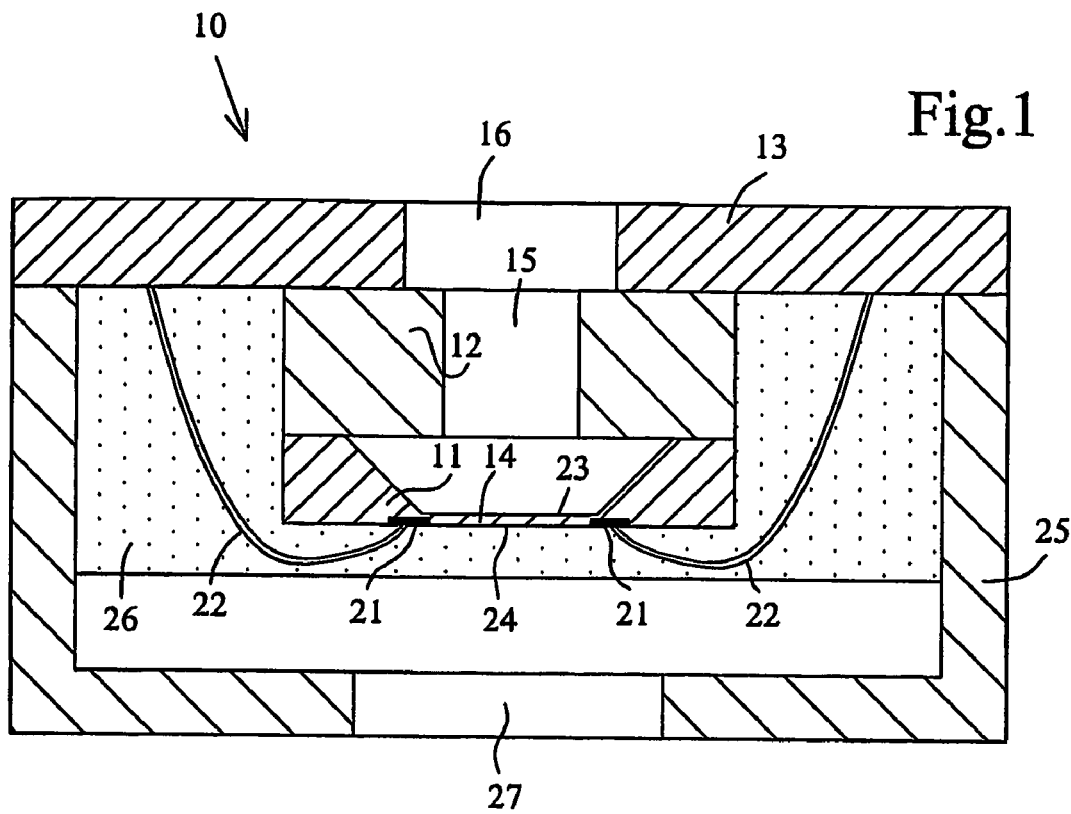
FIG. 1 is a section view of a silicon pressure sensor according to the known art.

In fact, with respect to the known art, the die (11) is no longer glued on a plate (12) (FIG. 1) but directly on the support (33), integrated in its thickness and less operations, less parts are required.

In addition, as the upper edge (28) of the die (11) is substantially on the same plane as the upper surface (37) of the support (33), the die (11) remains protected from stresses from the outside that could cause extra stress, and possibly read errors or even the die (11) becoming detached from the support (33).

Second embodiment

Described in FIG. 3 is a second embodiment of the sensor (30') according to the invention.

In the vicinity of the upper surface (137) of the support (133), in the seat (134), a step (138) is made that runs along the edge of the seat (134) itself.

The seat (134) has the same profile as the die (11), but its dimensions are greater than those of the die, in such a way as to leave a space free between the support (133) and the die (11) in which to insert the adhesive (40) for gluing.

The seat (134) may for instance have a width of about 0.1÷0.2 μm greater than that of the die (11).

The step (138) is made local to the upper surface (137) of the support (133), which is the part of the support that comes into contact with the fluid, the pressure of which has to be measured.

The die (11) is thus integrated in the seat (134), made in the thickness of the support (133) and is assembled in such a way that the upper edge (28) of the die (11) is in abutment with the step (138).

The surface of the part of the step (138) in contact with the upper edge (28) of the die (11), is lesser than the, surface of the upper edge (28) itself; in this way, a part of the surface of the upper edge (28) remains available to be coated by the adhesive (40), and the risk of the adhesive (40) spreading on to the membrane (14) during gluing, causing read errors, is avoided.

The sensor (30') made according to the second embodiment of the invention has the advantage that it permits more precise positioning of the die (U) on the support (133).

In addition, the sensor (30') improves the gluing between die (11) and support (134), since the surface of the die (11) concerned by the adhesive is of greater extent than that of the sensor of the first embodiment of the invention: the die (11) is glued, as well as on the lateral surface, also along a part of the upper edge (28).

In addition, the step (138) protects the transducer (11) from stresses that could come from the outside and cause extra stress, with possible read errors or even the die (11) becoming detached from the support (133).

Third embodiment

In FIG. 4 a third embodiment of the sensor (30") according to the invention is described.

The sensor (30") described has a step, which runs along the outer profile of the seat (234), and is made between the lower edge of the seat (234) and the lower surface (236) of the support (233).

The seat (234) is made on the inside of the support (233) and has, in the vicinity of the lower surface (236) of the support, a step (238) that runs along the edge of the seat (234).

The seat (234) has the same profile as the die (11), but its dimensions are greater than those of the die, in such a way as to leave a free space between the support (233) and the die (11) in which to insert the adhesive (40) for the gluing.

The seat (234) may for instance have a width of about 0.1÷0.2 µm greater than that of the die (11).

The step (238) is made local to the lower surface (236) of the support (233), which is the part of the support opposite that in contact with the fluid of which the pressure has to be measured.

The die (11) is therefore integrated in the seat (234), made in the thickness of the support (233), and is assembled in such a way that its outer face (24) is in abutment with the step (238).

The surface of the outer face (24) of the die (11) in the sensor (30") made according to the third embodiment of the invention, is greater than that of the die used in the sensors (30 and 30'), made according to the two embodiments described earlier. In this way, a part of the surface of the upper edge (28) is available to be coated by the adhesive (40), and the risk of the adhesive (40) spreading on to the membrane (14) during gluing, causing read errors, is avoided.

Part of the area of the outer face (24) is in contact with the step (238). In order to have the same free surface as in the sensors described in the first two embodiments (30 and 30'), the area of the outer face (24) of the die must therefore be greater than in the first two sensors (30 and 30').

For membranes of like dimensions, the die (11) must be slightly broader (+0.2 µm per side), so that the surface available for the pads and the resistors is the same as in the sensors (30' and 30"), made produced to the first two embodiments of the invention.

In addition to the advantages that are given by the first two embodiments, presence of the step (238) below the die (11) means that a sensor is obtained that can resist the stresses that are generally found in the presence of high pressures.

The invention claimed is:

1. Pressure sensor with an integrated structure comprising:
 a silicon die, having an upper surface including at least an upper edge and an inner face, and an outer surface on which piezoresistors are comprised, wherein at least the inner face of the die is in contact with a fluid the pressure of which is to be measured;
 a support having an upper surface, a thickness and a recessed seat in the thickness, the recessed seat adapted to receive the entire die, wherein the recessed seat and the die have the same profile; and
 a container including the support;
 wherein said die is integrated into the recessed seat in the thickness of the support.

2. Pressure sensor with integrated structure according to claim 1 wherein the support further comprises a lower surface, and the recessed seat passes through the support from the upper surface to the lower surface.

3. Pressure sensor with integrated structure according to claim 1, further comprising a step on the inner surface of the container, the step enabling improved gluing of the support.

4. Pressure sensor with integrated structure according to claim 1:
 wherein the upper edge of the die is substantially coplanar with the upper surface of the support.

5. Pressure sensor with integrated structure according to claim 1:
 wherein on the inner face of the die, in contact with the fluid the pressure of which is to be measured, is a layer of protection made from at least one of chromium, tantalum, silicon, or carbide alloys.

6. Pressure sensor with integrated structure according to claim 1:
 further comprising a step on the inside of the seat, running along an edge of the seat, in the vicinity of the upper surface of the support.

7. Pressure sensor with integrated structure according to claim 6 wherein the upper edge of the die is in abutment with the step.

8. Pressure sensor with integrated structure according to claim 7:
 wherein the surface of the part of the step, that is in contact with the upper edge of the die, is less than the surface of the upper edge itself.

9. Pressure sensor with integrated structure according to claim 1:
 further comprising a step on the inside of the seat, running along an edge of the seat, in the vicinity of the lower surface of the support.

10. Pressure sensor with integrated structure according to claim 9:
 wherein the upper edge of the die is substantially coplanar with the upper surface of the support.

11. Pressure sensor with integrated structure according to claim 9:
 wherein the outer face of the die is in abutment with the step.

12. Pressure sensor with an integrated structure according to claim 1, wherein the support further comprises a lower surface, and wherein the pressure sensor further comprises an electronic circuit built on the lower surface of the support, said electronic circuit being connected through bonding wires to the piezoresistors on the outer face of the die.

13. Pressure sensor with an integrated structure according to claim 1, wherein the support further comprises a lower surface, and wherein the pressure sensor further comprises a silicone resin layer coated on the lower surface of the support, said layer being capable of following deformations of the die.

14. Pressure sensor with an integrated structure according to claim 1, further comprising a container being suitable for putting the die in contact with the fluid the pressure of which is to be measured.

* * * * *